United States Patent [19]

van Dyk Soerewyn

[11] Patent Number: 4,536,825
[45] Date of Patent: Aug. 20, 1985

[54] LEADFRAME HAVING SEVERABLE FINGERS FOR ALIGNING ONE OR MORE ELECTRONIC CIRCUIT DEVICE COMPONENTS

[75] Inventor: Herman F. van Dyk Soerewyn, Peabody, Mass.

[73] Assignee: Unitrode Corporation, Lexington, Mass.

[21] Appl. No.: 594,745

[22] Filed: Mar. 29, 1984

[51] Int. Cl.³ ............................................... H05K 7/20
[52] U.S. Cl. .................................... 361/386; 361/421; 361/403; 357/70
[58] Field of Search ............... 361/421, 417, 419, 420, 361/380, 393, 395, 403, 386, 388; 357/70, 81; 174/52 FP, 16 HS; 29/827, 841, 854

[56] References Cited

U.S. PATENT DOCUMENTS

| | | | |
|---|---|---|---|
| 3,651,448 | 3/1972 | Pauza | 174/52 FP |
| 4,012,766 | 3/1977 | Phillips | 174/52 FP |
| 4,054,238 | 10/1977 | Lloyd | 174/52 FP |
| 4,224,637 | 9/1980 | Hargis | 174/52 FP |
| 4,471,158 | 9/1984 | Roberts | 174/52 FP |

*Primary Examiner*—G. P. Tolin
*Attorney, Agent, or Firm*—Weingarten, Schurgin Gagnebin & Hayes

[57] ABSTRACT

The present invention discloses a plurality of severable alignment fingers integrally formed with a leadframe for selectively aligning one or more electronic circuit device components, that may be of different physical dimensions, positioned on the leadframe. Upstanding positioning tabs are integrally formed on the sides, on the ends, or on both the sides and on the ends of corresponding alignment fingers that abut the confronting surfaces of the one or more electronic circuit device components positioned on the leadframe to selectively align the components. The upstanding positioning tabs may be so spaced apart on corresponding alignment fingers as to provide a supporting surface for partially supporting the confronting bottom surface of the electronic circuit device component positioned on the leadframe. The leadframe includes longitudinally extending dambars and transversely extending connector strips, and the alignment fingers can advantageously be integrally formed with the connector strips, with the dambars, or with both the dambars and the connector strips. The alignment fingers are preferably formed on the leadframe in such spaced relation that the upstanding positioning tabs abut corresponding corners of the electronic circuit device components, although other suitable spacing may be employed. The alignment fingers are severable from the leadframe prior to as well as after encapsulation.

9 Claims, 9 Drawing Figures

LEADFRAME HAVING SEVERABLE FINGERS FOR ALIGNING ONE OR MORE ELECTRONIC CIRCUIT DEVICE COMPONENTS

FIELD OF THE INVENTION

This invention is directed to the field of electronic circuit device manufacture, and more particularly, to a novel leadframe having severable fingers for aligning one or more electronic circuit device components.

BACKGROUND OF THE INVENTION

Electronic circuit devices typically comprise a plurality of electronic circuit device components. Such components include an electronic substrate having active electronic devices disposed thereon that are in electrical communication with preselected ones of a plurality of substrate contact pads, a leadframe having a like plurality of leads, and a heatsink. During the initial phases of assembly of such electronic circuit devices, the leadframe and substrate must be so positioned as to align individual ones of the leads of the leadframe in electrical communication with corresponding ones of the contact pads of the substrate, and the heatsink and substrate must be so positioned as to align the heatsink in thermal communication with the substrate. An electrically conductive bond is thereafter formed in each of the electrical interfaces defined between corresponding aligned ones of the substrate contact pads and leads of the leadframe, and a thermally conductive bond is formed in the thermal interface defined between the aligned substrate and heatsink. Thereafter, any additional components such as semiconductor active elements, resistors, and capacitors are electrically mounted to the assembly, and the device is suitably encapsulated. The portions of the leadframe not necessary for the completed device are then severed from the leads.

SUMMARY OF THE INVENTION

The present invention contemplates a plurality of selectively spaced alignment fingers integrally formed with and individually severable from a leadframe. The alignment fingers each include at least one integrally formed upstanding positioning tab. The upstanding positioning tabs of the plural alignment fingers are co-operative with the confronting surfaces of one or more electronic circuit device components positioned on the leadframe to selectively align the one or more components in relation to the leadframe. In preferred embodiment, the alignment fingers are integrally formed in such spaced relation on the leadframe that individual ones of the upstanding positioning tabs thereof abut corresponding ones of the corners of the one or more electronic circuit device components positioned on the leadframe. The alignment fingers each preferably include an integrally formed first upstanding positioning tab that abuts the confronting side surface of the corresponding corner of the one or more electronic circuit device components for providing lateral alignment thereof, and an integrally formed second spaced upstanding positioning tab that abuts the confronting end surface of the corresponding corner of the one or more electronic circuit device components for providing longitudinal alignment thereof. The first and second upstanding positioning tabs may both be integrally formed on the sides, on the ends, or on a side and on an end of the corresponding alignment finger, and may be so spaced-apart as to provide a surface for partially supporting the confronting bottom surface of the electronic circuit device component positioned on the leadframe. The upstanding positioning tabs may be provided with surfaces so bevelled as to allow ease of electronic circuit device component positioning on the leadframe. The alignment fingers are severable from the leadframe prior to encapsulation. Electronic circuit device components of the same or different size can be aligned that may or may not extend beyond the encapsulation. Additional upstanding positioning tabs may be integrally formed with each alignment finger where electronic circuit device components of different size are positioned on the leadframe. Heatsinks, electronic substrates, as well as resistors, capacitors and other electronic circuit device components can advantageously be selectively aligned.

BRIEF DESCRIPTION OF THE DRAWINGS

Other advantages and features of the present invention will become apparent as the invention becomes better understood by referring to the following exemplary and non-limiting detailed description of the preferred embodiments, and to the drawings, wherein.

DETAILED DESCRIPTION OF THE PREFERRED EMBODIMENTS

Figure 1A:
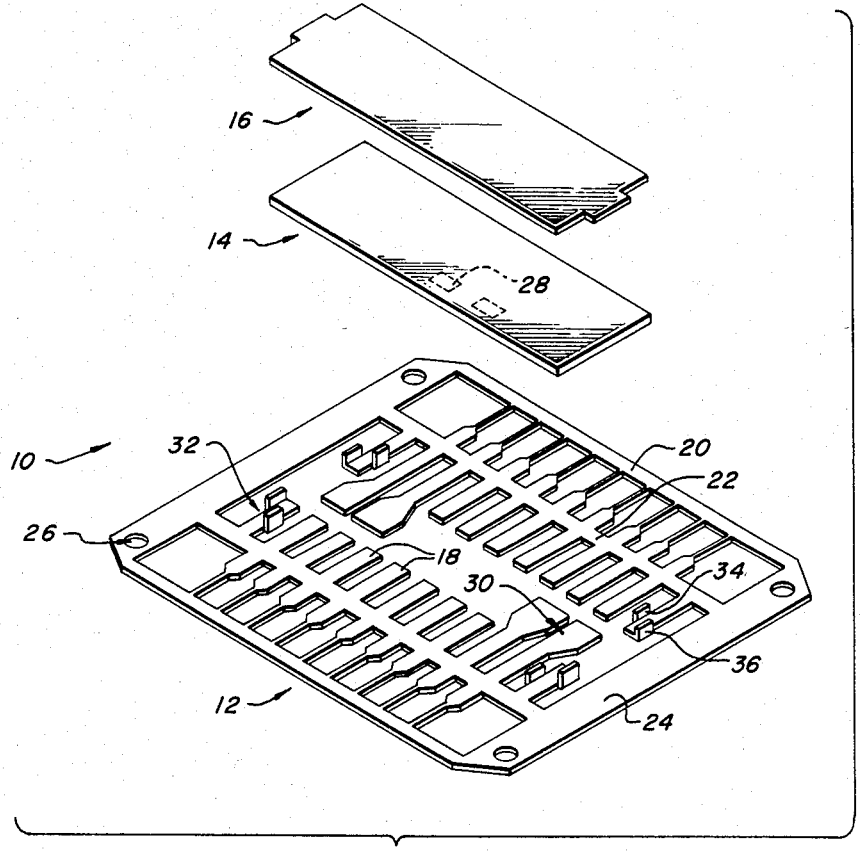
FIG. 1A is an exploded perspective view of an exemplary assembly of electronic circuit device components including a leadframe having severable fingers for aligning one or more electronic circuit device components according to the present invention.

Referring now to FIG. 1A, generally designated at 10 is an exemplary assembly of electronic circuit device components including a leadframe having severable fingers for aligning one or more electronic circuit device components according to the present invention. The assembly 10 includes a leadframe generally designated 12, an electronic substrate generally designated 14 positioned on the leadframe 12, and a heatsink generally designated 16 positioned on the substrate 14. The leadframe 12 is a metallic plate having a pattern defining a plurality of transversely extending electrodes 18 connected on their outer ends to a longitudinally extending tiebar 20, and connected at a point intermediate their ends to a longitudinally extending dambar 22. The tiebars 20 and the dambars 22 are connected to transversely extending connector strips 24 that form the sides of the leadframe 12. Apertures generally designated 26 are provided at each of the ends of the connector strips 24.

A plurality of contact pads 28 are laterally provided along the sides of the substrate 14. The pads 28 are in electrical communication with selected active electronic devices, not shown, disposed on the substrate 14 via printed circuit or other conductive paths. A plurality of spaced-apart severable supporting fingers generally designated 30 are integrally formed with the leadframe 12. The severable supporting fingers 30 in the illustrated embodiment are formed in spaced relation on corresponding dambars 22 adjacent opposed ends of a diagonal of the leadframe 12 for supporting the confronting bottom surface of the substrate 14 positioned thereon.

A plurality of transversely extending severable alignment fingers generally designated 32 are integrally formed with the dambars 22 of the leadframe 12 in selected spaced apart relation thereon, preferably adjacent corresponding corners of the substrate 14 and heatsink 16. Other spacing may be employed as well without departing from the inventive concept. The severable alignment fingers 32 align the substrate 14 and the heatsink 16 such that individual ones of the contact pads 28 are in electrical communication with corresponding ones of the inner ends of the leads 18 via a corresponding solder or other electrically conductive layer, not shown, and that the heatsink 16 is in thermal communication with the substrate 14 via a corresponding solder or other thermally conductive layer, not shown.

Figure 1B:
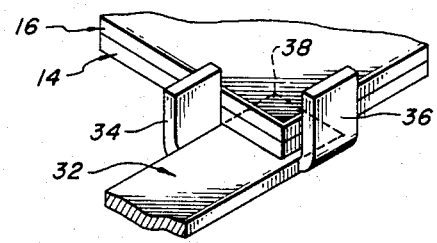
FIG. 1B is an enlarged fragmentary perspective view of severable alignment finger of the embodiment of FIG. 1A.

A first upstanding position tab 34 is integrally formed on each of the alignment fingers 32 that abuts the confronting side surface of the corresponding corner of the electronic circuit device components 14, 16 for providing lateral alignment thereof. A second upstanding positioning tab 36 is integrally formed on each of the alignment fingers 32 that abuts the confronting end surface of the corresponding corner of the electronic circuit device components 14, 16 for providing longitudinal alignment thereof. As can best be seen in FIG. 1B, the upstanding positioning tabs 34, 36 are integrally formed in such spaced relation on each of the alignment fingers 32 as to provide a supporting surface 38 that abuts and partially supports the confronting bottom surface of the corner of the substrate 14. After flowing the solder between the electrical and thermal interfaces such as by heating the selectively aligned assembly 10 in a furnace, the fingers 32 are individually severable from the leadframe 12. It should be noted that the fingers can be severed prior to encapsulation as well as severed after encapsulation.

Figure 2A:
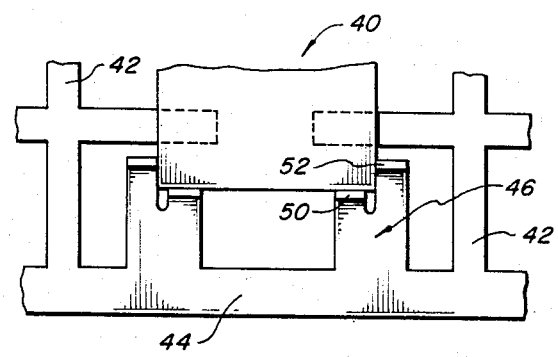
FIG. 2A is an enlarged fragmentary top plan view of another embodiment of the leadframe having severable fingers for aligning one or more electronic circuit device components according to the present invention.
Figure 2B:
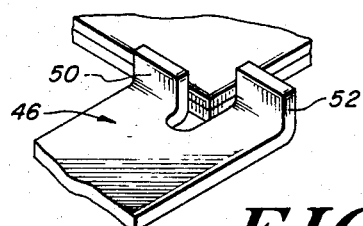
FIG. 2B is an enlarged fragmentary perspective view of a severable alignment finger of the embodiment of FIG. 2A.

Referring now to FIG. 2A, generally designated at 40 is an enlarged fragmentary plan view of another embodiment of the leadframe having severable fingers for aligning one or more electronic circuit device components according to the present invention. The leadframe 40 includes spaced longitudinally extending dambars 42 and spaced transversely extending connector strips 44, one of which is specifically illustrated. Severable alignment fingers generally designated 46 are integrally formed on the connector strips 44 in such spaced relation thereon as to be adjacent corresponding corners of the electronic circuit device components positioned on the leadframe 40. As can best be seen in FIG. 2B, first and second upstanding positioning tabs 50, 52 are integrally formed along the end of each of the severable alignment fingers 46. The tabs 50, 52 each abut the confronting end and side surfaces of the corresponding corners of the electronic circuit device components positioned on the leadframe 40 for respectively providing longitudinal and lateral alignment thereof.

Figure 3:
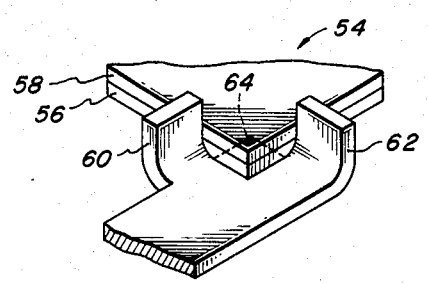
FIG. 3 is an enlarged fragmentary perspective view of another embodiment of a severable alignment finger of the leadframe having severable fingers for aligning one or more electronic circuit device components according to the present invention.

Referring now to FIG. 3, generally designated at 54 is an enlarged fragmentary perspective view of a severable alignment finger of another embodiment of the leadframe having severable alignment fingers for aligning one or more electronic circuit device components according to the present invention. The alignment fingers 54 are integrally formed with a leadframe in such spaced relation thereon as to be adjacent corresponding corners of electronic circuit device components 56, 58 positioned on the leadframe. A first upstanding position tab 60 is integrally formed at a point on a side of each alignment finger 54 that is spaced from its end. A second upstanding positioning tab 62 is integrally formed on a portion of the end of each alignment finger 54. The tabs 60, 62 define therebetween a supporting surface 64 for partially supporting the confronting bottom surface of the corresponding corner of the electronic circuit device component 56. The upstanding positioning tabs 60, 62 abut the confronting side and end surfaces of the corresponding corners of the one or more electronic circuit device components positioned on the leadframe for selectively providing both lateral and longitudinal alignment thereof.

It should be noted that in the embodiments of FIGS. 1, 2, and 3, the heatsink and electronic substrate have substantially the same dimensions.

Figure 4A:
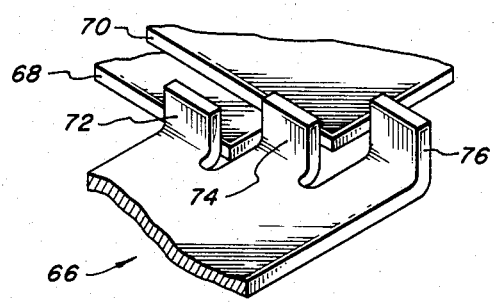
FIG. 4A is an enlarged fragmentary perspective view of a severable alignment finger of another embodiment of the leadframe having severable fingers for aligning one or more electronic circuit device components according to the present invention.

Referring now to FIG. 4A, generally designated at 66 is an enlarged fragmentary perspective view illustrating a severable alignment finger of another embodiment of a leadframe having severable fingers for aligning one or more electronic circuit device components having different physical dimensions according to the present invention. The alignment fingers 66 are integrally formed with respective dambars of a leadframe in such spaced relation thereon as to be adjacent corresponding corners of electronic circuit device components 68, 70 of different physical dimensions positioned on the leadframe. A first upstanding positioning tab 72 is integrally formed with the portion of the end of each of the alignment fingers 66. The upstanding positioning tab 72 abuts the confronting side surface of the corresponding corner of the electronic circuit device component 68 for providing lateral alignment thereof. A second upstanding positioning tab 74 is integrally formed on a portion of the end of each of the alignment fingers 66 in spaced relation to the tab 72. The upstanding positioning tab 74 abuts the confronting end surface of the corresponding corner of the electronic circuit device component 68 as well as abuts the confronting side surface of the corresponding corner of the electronic circuit device component 70 for providing both longitudinal alignment of the component 68 and lateral alignment of the component 70. An upstanding positioning tab 76 is integrally formed on another portion of the end of the alignment finger 66 in spaced relation to the tabs 72, 74. The upstanding positioning tab 76 abuts the confronting end surface of the corresponding corner of the component 70 providing longitudinal alignment thereof. It will readily be appreciated that the severable alignment fingers 66 could be integrally formed on respective connector strips of the leadframe without departing from the inventive concept.

Figure 4B:
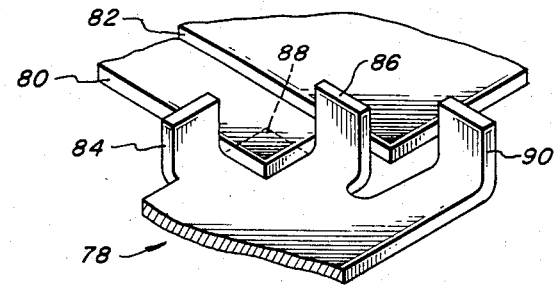
FIG. 4B is an enlarged fragmentary perspective view of a severable alignment finger of another embodiment of the leadframe having severable fingers for aligning one or more electronic circuit device components according to the present invention.

Referring now to FIG. 4B, generally designated at 78 is an enlarged fragmentary perspective view of a severable alignment finger of another embodiment of a leadframe having severable fingers for aligning one or more electronic circuit device components having different physical dimensions according to the present invention. The alignment fingers 78 are integrally formed with respective dambars of a leadframe in such spaced relation thereon as to be adjacent corresponding corners of electronic circuit device components 80, 82 of different physical dimensions positioned on the leadframe. A first upstanding positioning tab 84 is integrally formed at a point on a side of each alignment finger 78 that is spaced from its end. The upstanding positioning tab 84 abuts the confronting side surface of the corresponding corner of the electronic circuit device component 80 for providing lateral alignment thereof. A second upstanding positioning tab 86 is integrally formed on a portion of the end of each alignment finger 78 in spaced relation to the tab 84. The tabs 84, 86 define therebetween a supporting surface 88 for partially supporting the confronting bottom surface of the corresponding corner of the electronic circuit device component 80. The upstanding positioning tab 86 abuts the confronting end surface of the corresponding corner of the component 80 for providing longitudinal alignment thereof as well as abuts the confronting side surface of the corresponding corner of the component 82 for providing lateral alignment thereof. A third upstanding positioning tab 90 is integrally formed on another portion of the end of each alignment finger 78 in spaced relation to the tabs 84, 86. The positioning tab 90 abuts the confronting end surface of the corresponding corner of the electronic circuit device component 82 for providing longitudinal alignment thereof. It will readily be appreciated that the severable alignment fingers 78 could be formed on respective connector strips of the leadframe without departing from the inventive concept.

Figure 4C:
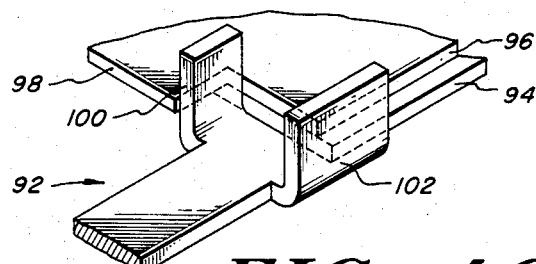
FIG. 4C is an enlarged fragmentary perspective view of a severable alignment finger of yet another embodiment of the leadframe having severable fingers for aligning one or more electronic circuit device components according to the present invention.

Referring now to FIG. 4C, generally designated at 92 is an enlarged fragmentary perspective view illustrating a severable alignment finger of another embodiment of a leadframe having severable fingers for aligning one or more electronic circuit device components having different physical dimensions according to the present invention. The alignment fingers 92 are integrally formed with respective connector strips of the leadframe in such spaced relation thereon as to be adjacent corresponding corners of electronic circuit device components 94, 96 of different physical dimensions positioned on the leadframe. The electronic circuit device component 94 may be a substrate, and the electronic circuit device component 96 may be a heatsink having hold-down flanges 98 on each end thereof. A first upstanding positioning tab 100 is integrally formed with a portion of the side of each of the alignment fingers 92. The upstanding positioning tab 100 abuts the confronting side surface of the corresponding corner of the flange 98 of the component 96 for providing lateral alignment of the component 96, and abuts the confronting end surfaces of the corresponding corners of the electronic circuit device components 94, 96 for providing longitudinal alignment thereof. A second upstanding positioning tab 102 is integrally formed on a portion of the other side of each of the alignment fingers 102. The upstanding positioning tab 102 abuts the confronting side surface of the corresponding corner of the electronic circuit device component 94 for providing lateral alignment thereof.

Figure 5:
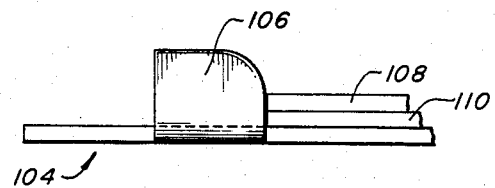
FIG. 5 is a fragmentary schematic side view of a severable alignment finger of a further embodiment of the leadframe having severable fingers for aligning one or more electronic circuit device components according to the present invention.

Referring now to FIG. 5, generally designated at 104 is an enlarged fragmentary schematic side view of a severable alignment finger of another embodiment of the leadframe having severable fingers for aligning one or more electronic circuit device components according to the present invention. The severable alignment fingers 104 have upstanding positioning tabs 106 with surfaces so beveled as to allow ease of positioning of electronic circuit device components 108, 110 on the leadframe.

It will be appreciated that many modifications of the present invention will become apparent to those skilled in the art without departing from the scope of the appended claims.

What is claimed is:

1. Leadframe apparatus selectively aligning an electronic circuit device component having four corners positioned on the leadframe apparatus, comprising:

four elongated fingers having free ends that are each integrally formed in spaced-apart relation on, and individually severable from, the leadframe apparatus at points remote from their free ends and individually proximate a corresponding corner of the electronic circuit device component positioned on the leadframe apparatus; and two upstanding positioning tabs integrally formed with each of said elongated and severable fingers at a point thereon proximate the corresponding free end thereof and individually abutting the corresponding confronting corner surface of the electronic circuit device component positioned on the leadframe apparatus with one of said tabs providing longitudinal alignment of and with the other of said tabs providing lateral alignment of the electronic circuit device component positioned on the leadframe apparatus.

2. The invention of claim 1, wherein each of said free ends of said fingers has side portions and an end portion, and wherein each of said two upstanding positioning tabs are respectively integrally formed on corresponding ones of said side portions defining therebetween an included surface upon which the confronting bottom surface of the circuit device rests.

3. The invention of claim 1, wherein each of said free ends of said fingers has side portions and an end portion, and wherein one of said upstanding positioning tabs is integrally formed on one side portion thereof and the other one of said upstanding positioning tabs is integrally formed on the end portion thereof defining therebetween an included surface upon which the confronting bottom surface of the circuit device rests.

4. Leadframe apparatus selectively aligning an electronic substrate having corners and a heat sink having corners positioned on the leadframe apparatus, comprising:

four elongated fingers having free ends that are each integrally formed in spaced-apart relation on, and individually severable from, the leadframe apparatus at points remote from their free ends and individually both proximate a corresponding corner of said electronic substrate and proximate a corresponding corner of said heat sink; and two upstanding positioning tabs integrally formed with each of said elongated and severable fingers at a point thereon proximate the corresponding free end thereof and individually abutting the corresponding confronting corner surface both of the electronic substrate and of the heat sink positioned on the leadframe apparatus with one of said tabs providing lateral alignment of said electronic substrate as well as of said heat sink and with the other of said tabs providing longitudinal alignment of said electronic substrate as well as of said heat sink.

5. The invention of claim 4, wherein each of said fingers has side portions and an end portion, and wherein one of said positioning tabs is integrally formed with one of said side portions and where the other one of said positioning tabs is integrally formed with said end portion defining therebetween an included surface upon which the confronting surface of the electronic substrate rests.

6. The invention of claim 4, wherein said heat sink and said electronic substrate have different physical dimensions, wherein said heat sink has hold-down flanges integrally formed on opposed longitudinal ends thereof defining four additional corners, wherein said alignment fingers each have side portions, and wherein one of said positioning tabs is integrally formed with one of said side portions and abuts the electronic substrate and a corresponding one of the additional corners of the heat sink for providing lateral adjustment of the electronic substrate and the heat sink and for providing longitudinal adjustment of the heat sink, and wherein the other of the upstanding positioning tabs is integrally formed on the other side portion of each of the fingers and abuts the substrate for providing longitudinal alignment thereof.

7. Leadframe apparatus selectively aligning an electronic substrate and a heat sink of different physical dimensions positioned on the leadframe apparatus, each of the electronic substrate and heat sink defining four corners, comprising:

four elongated fingers having free ends that are each integrally formed in spaced-apart relation on, and individually severable from, the leadframe apparatus at points remote from their free ends and individually proximate a corresponding corner of the electronic substrate as well as the heat sink; and three upstanding positioning tabs integrally formed with each of said elongated and severable fingers at a point thereon proximate the corresponding free end thereof, with one of the positioning tabs abutting the electronic substrate for providing lateral alignment thereof, with another of the positioning tabs abutting both the substrate and the heat sink for providing both lateral and longitudinal adjustment of each of them respectively, and with the remaining positioning tab abutting the heat sink for providing longitudinal alignment thereof.

8. The invention of claim 7, wherein each of said fingers has an end portion and side portions, and wherein said three tabs are integrally formed on said end surface.

9. The invention of claim 7, wherein each of said fingers has an end portion and side portions, and wherein one of the tabs is formed one of said side portions, and wherein the other two of said tabs are integrally formed on said end portion thereof defining between one of said end portion tabs and said side portion tabs an included surface upon which the confronting surface of the electronic substrate rests.

* * * * *

UNITED STATES PATENT AND TRADEMARK OFFICE
CERTIFICATE OF CORRECTION

PATENT NO. : 4,536,825
DATED : August 20, 1985
INVENTOR(S) : Herman F. van Dyk Soerewyn It is certified that error appears in the above-identified patent and that said Letters Patent is hereby corrected as shown below:

Column 3, line 51, "position" should read --positioning--

Column 4, line 33, "position" should read --positioning--

Column 6, line 13, "fingers 102." should read --fingers 92.--

Signed and Sealed this

Eleventh Day of November, 1986

Attest:

DONALD J. QUIGG

Attesting Officer     Commissioner of Patents and Trademarks